US009601999B2

United States Patent
Rutkowski

(10) Patent No.: US 9,601,999 B2
(45) Date of Patent: *Mar. 21, 2017

(54) DYNAMIC SWITCH SCALING FOR SWITCHED-MODE POWER CONVERTERS

(71) Applicant: QUALCOMM Incorporated, San Diego, CA (US)

(72) Inventor: Joseph D Rutkowski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 14/625,068

(22) Filed: Feb. 18, 2015

(65) Prior Publication Data

US 2015/0162836 A1 Jun. 11, 2015

Related U.S. Application Data

(63) Continuation of application No. 13/752,267, filed on Jan. 28, 2013, now Pat. No. 8,988,059.

(51) Int. Cl.
*H02M 3/158* (2006.01)
*G05F 3/02* (2006.01)
(Continued)

(52) U.S. Cl.
CPC .............. *H02M 3/158* (2013.01); *G05F 3/02* (2013.01); *H02J 1/00* (2013.01); *H02M 3/1588* (2013.01);
(Continued)

(58) Field of Classification Search
CPC .. H02M 3/158; H02M 3/1588; H02M 3/1582; H02M 3/1584
(Continued)

(56) References Cited

U.S. PATENT DOCUMENTS 6,091,297 A 7/2000 Bar-David et al.
6,249,111 B1 6/2001 Nguyen
(Continued)

FOREIGN PATENT DOCUMENTS

EP 1608066 A1 12/2005

OTHER PUBLICATIONS

International Search Report and Written Opinion—PCT/US2014/012804—ISA/EPO—Jun. 26, 2014.
(Continued)

*Primary Examiner* — Gary L Laxton
*Assistant Examiner* — Kyle J Moody
(74) *Attorney, Agent, or Firm* — Haynes and Boone, LLP

(57) ABSTRACT

Techniques for optimizing the trade-off between minimizing switching losses and minimizing conduction losses in a buck converter. In an aspect, each of a high-side switch and a low-side switch may be implemented as a plurality of parallel-coupled transistors, each transistor having an independently controllable gate voltage, allowing adjustment of the effective transistor size. In response to the target voltage of the buck converter corresponding to a relatively high voltage range, more high-side switch transistors and fewer low-side switch transistors may be selected. Similarly, in response to the target voltage corresponding to a relatively low voltage range, more low-side switch transistors and fewer high-side switch transistors may be selected. In an aspect, the techniques may be applied during a pulse-frequency modulation mode.

18 Claims, 9 Drawing Sheets

(51) Int. Cl.
*H02J 1/00* (2006.01)
*H03K 17/12* (2006.01)
*H02M 1/088* (2006.01)
*H02M 1/00* (2006.01)

(52) U.S. Cl.
CPC ........... *H03K 17/122* (2013.01); *H02M 1/088* (2013.01); *H02M 2001/0032* (2013.01); *H02M 2001/0054* (2013.01); *Y02B 70/1466* (2013.01); *Y02B 70/1491* (2013.01)

(58) Field of Classification Search
USPC .......................................... 323/225, 271, 272
See application file for complete search history.

(56) References Cited

U.S. PATENT DOCUMENTS

| | | | |
|---|---|---|---|
| 6,404,173 B1 | 6/2002 | Telefus | |
| 6,429,633 B1 | 8/2002 | Kajiwara et al. | |
| 6,437,641 B1 | 8/2002 | Bar-David | |
| 6,492,867 B2 | 12/2002 | Bar-David | |
| 6,597,157 B1 | 7/2003 | Boeckmann et al. | |
| 6,831,519 B2 | 12/2004 | Bar-David et al. | |
| 6,985,039 B2 | 1/2006 | Bar-David et al. | |
| 6,995,995 B2 | 2/2006 | Zeng et al. | |
| 7,026,795 B2 | 4/2006 | So | |
| 7,046,090 B2 | 5/2006 | Veinblat | |
| 7,257,384 B2 | 8/2007 | Bar-David et al. | |
| 7,321,222 B2 | 1/2008 | Hojo | |
| 7,492,135 B2 | 2/2009 | Saeki et al. | |
| 7,538,526 B2 | 5/2009 | Kojima et al. | |
| 7,675,757 B2 | 3/2010 | Nakamura | |
| 7,710,203 B2 | 5/2010 | Bar-David et al. | |
| 7,746,042 B2 | 6/2010 | Williams et al. | |
| 7,782,132 B2 | 8/2010 | Plotnik et al. | |
| 7,899,417 B2 | 3/2011 | Elia | |
| 7,907,429 B2 | 3/2011 | Ramadass et al. | |
| 7,932,780 B2 | 4/2011 | Elia | |
| 7,994,769 B2 | 8/2011 | Ohtake et al. | |
| 8,076,915 B2 | 12/2011 | Nakazawa | |
| 8,107,902 B2 | 1/2012 | Elia | |
| 8,193,860 B2 | 6/2012 | Cohen | |
| 8,217,634 B2 | 7/2012 | Lu et al. | |
| 8,988,059 B2 * | 3/2015 | Rutkowski | H02J 1/00 323/272 |
| 2003/0038615 A1 | 2/2003 | Elbanhawy | |
| 2005/0057238 A1 | 3/2005 | Yoshida | |
| 2006/0038543 A1 | 2/2006 | Hazucha et al. | |
| 2009/0080281 A1 | 3/2009 | Hashiba | |
| 2009/0098846 A1 | 4/2009 | Elia | |
| 2010/0001704 A1 * | 1/2010 | Williams | H02M 3/158 323/283 |
| 2010/0013453 A1 | 1/2010 | Cha | |
| 2011/0285378 A1 | 11/2011 | Tamaoka | |
| 2012/0044014 A1 | 2/2012 | Stratakos et al. | |
| 2012/0229106 A1 | 9/2012 | Lai et al. | |
| 2013/0221937 A1 | 8/2013 | Yan et al. | |
| 2013/0241660 A1 | 9/2013 | Midya | |
| 2014/0210447 A1 | 7/2014 | Rutkowski | |
| 2014/0210548 A1 | 7/2014 | Shi et al. | |
| 2015/0333703 A1 * | 11/2015 | Liu | H02M 3/07 330/296 |

OTHER PUBLICATIONS

Trescases O., et al., "Predictive Efficiency Optimization for DC-DC Converters With Highly Dynamic Digital Loads," IEEE Transactions on Power Electronics, vol. 23, No. 4, pp. 1859-1869, Jul. 2008.

* cited by examiner

Vout_target => {Vlow}

DYNAMIC SWITCH SCALING FOR SWITCHED-MODE POWER CONVERTERS

CROSS-REFERENCE TO RELATED APPLICATIONS

This application is a continuation of U.S. application Ser. No. 13/752,267 for "Dynamic Switched Scaling for Switched-Mode Power Converters" filed Jan. 28, 2013, which is incorporated herein by reference.

BACKGROUND

Field

The disclosure relates to techniques for increasing power efficiency in a switched-mode power converter.

Background

Buck converters are a type of switched-mode power converter designed to efficiently step down a supply voltage, e.g., a battery voltage of a system, from a first level to a second lower level. A buck converter typically includes a high-side switch and a low-side switch configured to alternately couple an inductor to an output voltage or ground. The high-side and low-side switches may be configured to drive the output voltage to a predetermined target output voltage using a plurality of schemes known in the art, e.g., pulse-width modulation (PWM), pulse-frequency modulation (PFM), etc.

In a PFM mode of operation, the high-side and low-side switches are configured to vary the frequency of a train of pulses that charge and discharge the inductor. In PFM, there are at least two sources of power losses affecting the efficiency of the buck converter circuit. First, turning the switches on and off to generate the train of pulses leads to "switching losses," due to the current required to charge and discharge various capacitances in the switches. Second, sinking or sourcing DC current through the switches leads to "conduction losses," arising from the finite on-resistance of the switches themselves. Together, such losses undesirably decrease the power efficiency of the buck converter circuit as well as other types of switched-mode power converters.

It would be desirable to provide techniques for optimizing the operation of a switched-mode power converter such as a buck converter employing high-side and/or low-side switches to improve the overall power efficiency of the circuit.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
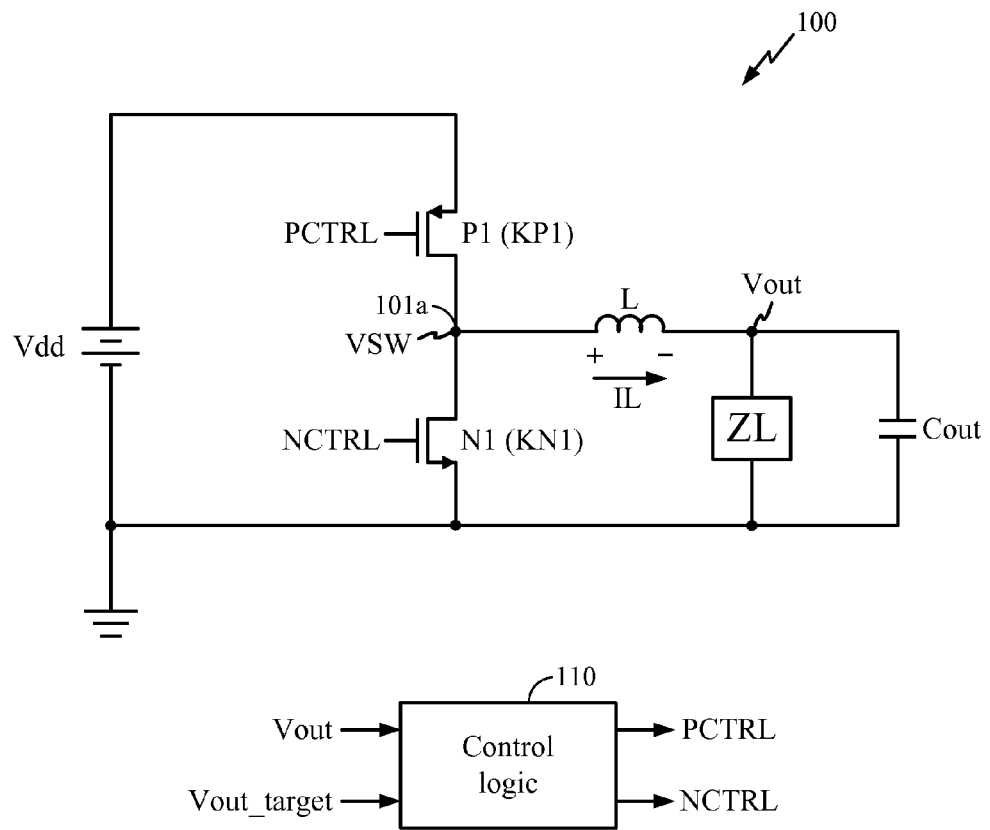
FIG. 1 illustrates a prior art implementation of a buck converter.

FIG. 1 illustrates a prior art implementation of a buck converter 100. Note FIG. 1 is shown for illustrative purposes only, and is not meant to limit the scope of the present disclosure to any particular buck converter topology shown. In this specification and in the claims, the term "switch" may include a "transistor switch," or it may include other types of switches, e.g., scaling relays etc.

In FIG. 1, the buck converter 100 includes switching transistors P1 (also denoted the "high-side switch") and N1 (also denoted the "low-side switch") coupled to an inductor L at a switching node 101a, at which a switching voltage VSW is present. The inductor L is coupled to a load ZL and capacitor Cout, which support an output voltage Vout. Per normal buck converter operation, during a charging phase (e.g., of duration TP) of a cycle (e.g., of duration T), P1 is on and N1 is off, and the switching node 101*a* couples the inductor L to Vdd through P1. During a discharging phase (e.g., of duration TN) of the cycle, N1 is on and P1 is off, and the switching node 101*a* thereby couples the inductor L to ground.

P1 and N1 are coupled to gate control voltages PCTRL and NCTRL, respectively. To configure PCTRL and NCTRL, a control logic block 110 may implement a scheme known as pulse-frequency modulation (PFM) under relatively light load conditions, e.g., low load current or large ZL. According to one implementation of PFM, block 110 may turn on P1 to cause the inductor current IL to ramp up to a pre-defined level, and then turn off P1. Subsequently, block 110 may turn on N1 to allow the inductor current IL to ramp down to zero, and then turn off N1. Block 110 may repeat this sequence with varying frequency until Vout is above a predefined regulation point. Once Vout exceeds the regulation point, block 110 may stop the pulses (e.g., keep both P1 and N1 off) until Vout falls below the regulation point again.

Note while one implementation of PFM is described hereinabove, one of ordinary skill in the art will appreciate that other PFM control schemes for P1 and N1 are known in the art. For example, alternative PFM control schemes may vary the frequency of the switching based on other parameters of the circuitry, e.g., load current, inductor current, switch current, etc. It will be appreciated that the techniques of the present disclosure may readily be adapted to support such alternative implementations as well.

Figure 2:
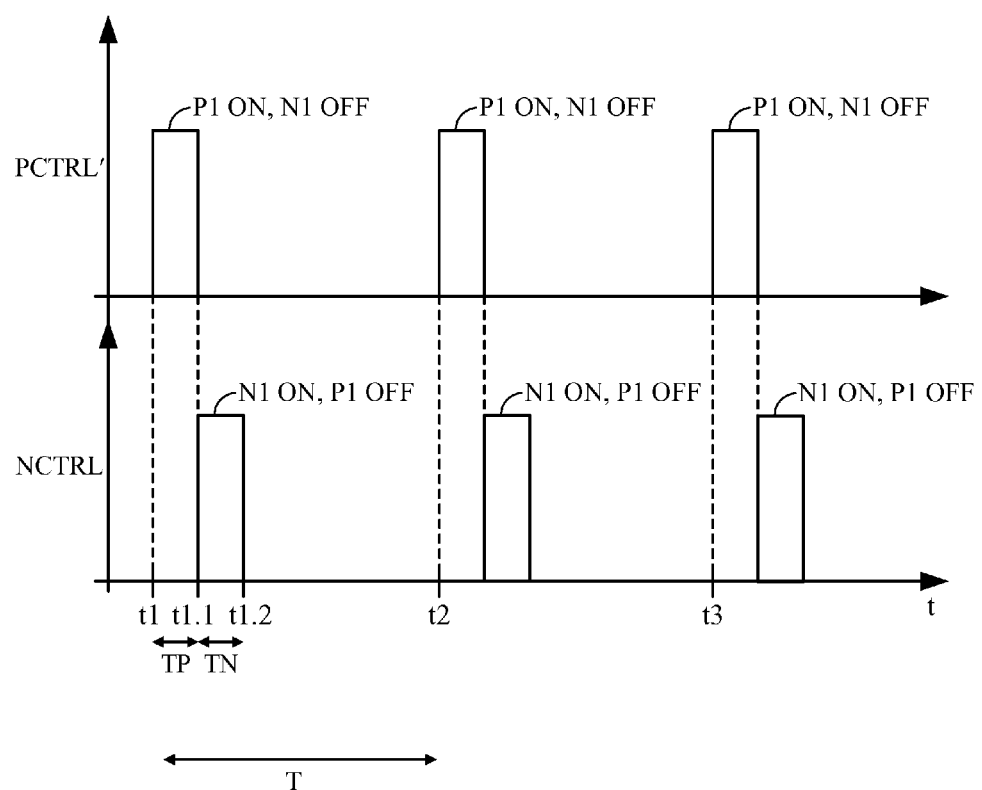
FIG. 2 illustrates exemplary signaling waveforms for PCTRL and NCTRL showing certain aspects of the present disclosure.

FIG. 2 illustrates exemplary signaling waveforms for PCTRL and NCTRL showing certain aspects of the present disclosure. Note FIG. 2 is shown for illustrative purposes only, and is not meant to limit the scope of the present disclosure to any particular signaling waveforms, e.g., any particular duty cycles or frequencies for the waveforms shown. Further note that in FIG. 2, the inverse of PCTRL, or PCTRL', is shown and described for ease of illustration due to the operating principles of a PMOS transistor. In particular, a low voltage for PCTRL turns P1 on, and therefore a high voltage for PCTRL' turns P1 on, etc.

In FIG. 2, from time t1 to t1.1(corresponding to a duration TP), P1 is turned on and N1 is turned off. From t1.1 to t1.2(corresponding to a duration TN), N1 is turned on and P1 is turned off. From t1.2 to t2, both N1 and P1 are off, and the cycle re-commences at t2. The time from t1 to t2 corresponds to the cycle duration T, which determines the frequency f=1/T. In a typical implementation of PFM, the pulse frequency f may be varied over time to adjust the output voltage Vout and load current. Note in alternative implementations of PFM, multiple groups of pulses may be provided every cycle, e.g., N1 and P1 may be turned on in more than one "cluster" throughout the duration of each cycle.

It will be appreciated that power dissipation in the switches may arise from at least two factors. First, "switching losses" arise from the finite amount of charge that needs to be transferred to switch each transistor, e.g., to turn a transistor on or off, during each cycle. In general, the switching losses are due to various capacitances of the transistor, e.g., the gate-to-source capacitance, gate-to-drain capacitance, etc. Switching losses occur every time a device is enabled or disabled, and are generally independent of the duration of time for which such device is enabled. It will be appreciated that, all else being equal, larger transistors (e.g., transistors having a large width-to-length ratio) will generally experience greater switching losses, since larger transistors are generally associated with larger capacitances.

Second, "conduction losses" or "DC losses" arise from the finite resistance (e.g., RDSon, or drain-to-source on-resistance) present when current flows from the drain to the source of each transistor. The drain-to-source current causes a voltage drop across the device, and corresponding DC power dissipation. Conduction losses are proportional to the time the device is conducting, i.e., when the device is supporting current flow between its drain and source. It will be appreciated that larger transistors will generally experience less conduction losses, since larger transistors are generally associated with less RDSon.

In view of the nature of switching losses and conduction losses described hereinabove, it will be appreciated that selecting an optimal size for the transistors (e.g., P1 and N1) of a buck converter, and generally any switched-mode power converter, requires balancing the competing considerations of lowering switching losses (e.g., by decreasing transistor size) and lowering conduction losses (e.g., by increasing transistor size).

For a buck converter operating in PFM mode, the switching and conduction losses are further related to the output voltage Vout of the buck converter as follows. In particular, it will be appreciated that the rate of increase in the inductor current IL is related to (Vdd−Vout)/L, wherein L is the inductance. For a given L, the rate of current increase (e.g., when P1 is turned on and N1 is turned off) is largest when Vout is smallest, since the rate of increase is (Vdd−Vout)/L during charging. Conversely, the rate of current decrease (i.e., when P1 is turned off and N1 is turned on) is largest when Vout is largest, since the rate of increase is −Vout/L during discharging.

Accordingly, when Vout is low, then the high-side switch (or P1) will be enabled for a relatively short period of time. During this short period of time, the conduction losses through P1 will be relatively smaller compared to the switching losses. On the other hand, when Vout is high, P1 will be enabled for a relatively long period of time, and therefore the conduction losses will be relatively greater compared to the switching losses. Note the low-side switch (or N1) will experience the opposite behavior. In particular, when Vout is low, N1 will be enabled for a relatively long period of time, and the conduction losses will be relatively greater compared to the switching losses. When Vout is high, the inductor current IL ramps down quickly, so N1 will only be enabled for a short period of time. Thus, for low Vout the conduction losses for N1 will be relatively less compared to the switching losses.

It would be desirable to provide improved techniques for optimizing the operation of buck converters and other type of switched-mode power converters to reduce switching and conduction losses and thereby increase efficiency. According to the present disclosure, in a low-current mode such as PFM mode, the size of the switches may be dynamically adjusted based on a target output voltage to optimize the trade-offs between switching and conduction losses.

Figure 3:
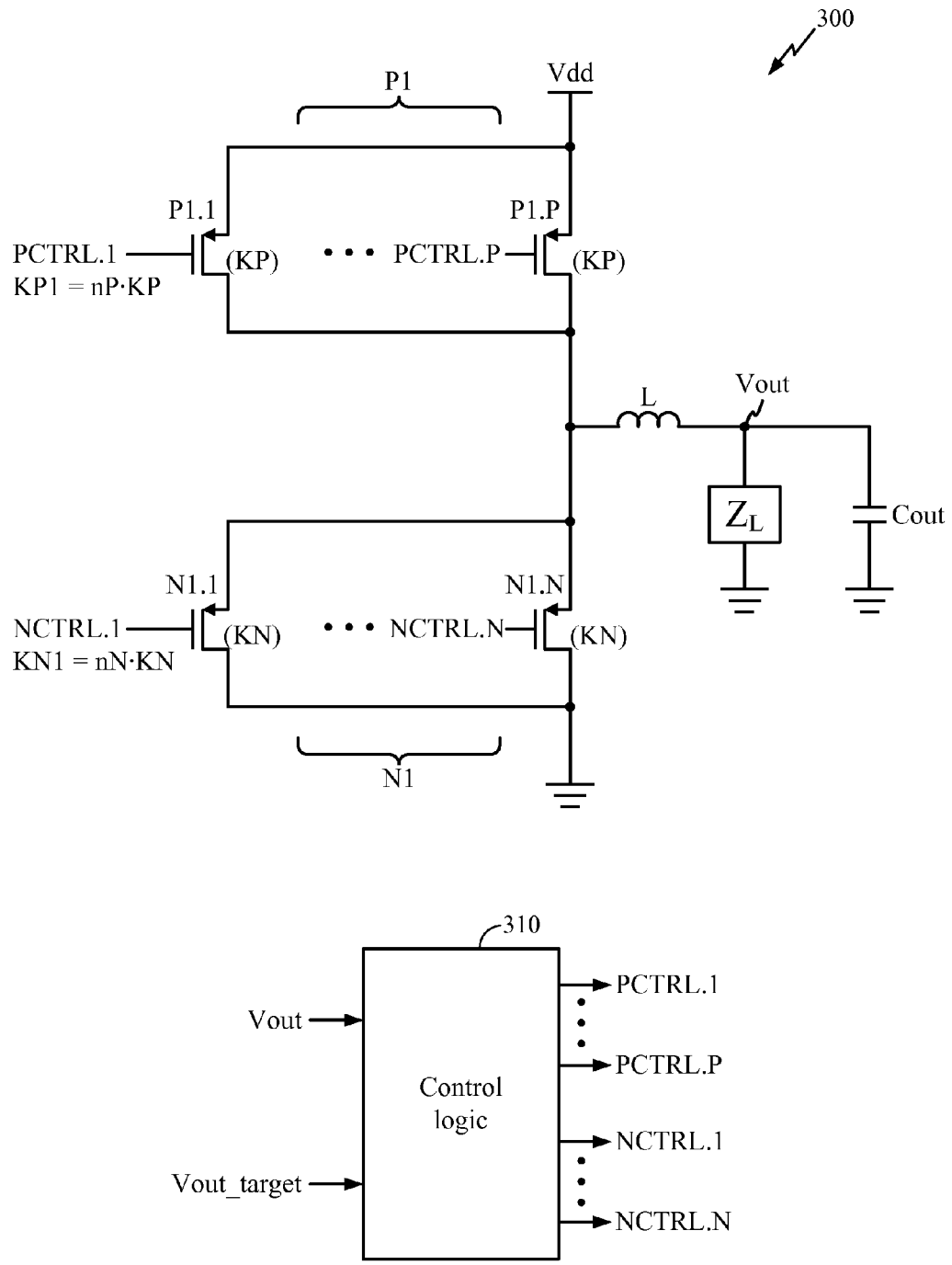
FIG. 3 illustrates an exemplary embodiment of a dynamic switch size adjustment apparatus according to the present disclosure.

FIG. 3 illustrates an exemplary embodiment 300 of a dynamic switch size adjustment apparatus according to the present disclosure. Note FIG. 3 is shown for illustrative purposes only, and is not meant to limit the scope of the present disclosure. For example, one of ordinary skill in the art will appreciate that switch size adjustment may be accomplished using other techniques besides turning on or off a plurality of transistors coupled in parallel. Such alternative exemplary embodiments are contemplated to be within the scope of the present disclosure.

In FIG. 3, the high-side switch P1 is shown implemented as a plurality P of parallel-coupled PMOS transistors P1.1 through P1.P. Each of P1.1 through P1.P is coupled to a corresponding gate control voltage PCTRL.p, wherein p is an index from 1 to P, such that any or all of the P PMOS transistors may be selectively enabled or disabled at any time. In FIG. 3, each of the P transistors P1.1 through P1.P has an identical size KP, such that if, e.g., a subset nP<=P of the PMOS transistors are enabled, then the overall effective PMOS size KP1 would be nP·KP. Note in alternative exemplary embodiments, not all of the transistors P1.1 through P1.P need to have the same size, and alternative sizing schemes may be readily utilized, e.g., a binary-weighted scheme wherein the transistors may be sized as KP, 2·KP, 4·KP, etc. Such alternative exemplary embodiments are contemplated to be within the scope of the present disclosure.

Similarly, N1 is shown implemented as a plurality N of parallel-coupled NMOS transistors N1.1 through N1.N. Note the plurality N corresponding to the number of parallel-coupled NMOS transistors need not be the same as the plurality P corresponding to the number of parallel-coupled PMOS transistors, although in certain exemplary embodiments, N may be equal to P. In FIG. 3, each of N1.1 through N1.N is coupled to a corresponding gate control voltage NCTRL.n, wherein n is an index from 1 to N, such that any or all of the N NMOS transistors may be selectively enabled or disabled at any time. In FIG. 3, each of the N transistors N1.1 through N1.N has an identical size KN, such that, if, e.g., a subset nN<=N of the NMOS transistors are enabled, then the overall effective NMOS size KN1 would be nN<·KN. Note in alternative exemplary embodiments, not all of the transistors N1.1 through N1.N need to have the same size, and alternative sizing schemes may be readily utilized. Such alternative exemplary embodiments are contemplated to be within the scope of the present disclosure.

Further shown in FIG. 3 is a control logic block 310 for generating the control voltages PCTRL.1 through PCTRL.P and NCTRL1 through NCTRL.N for each of the NMOS and PMOS transistors shown. Block 310 determines the gate control voltages for the parallel-coupled transistors based on receiving the target output voltage Vout target for the buck converter 300. In an exemplary embodiment, block 310 may include logical circuitry for controlling the effective sizes of switches P1 and N1 based on the target output voltage, as further described hereinbelow with reference to FIG. 4.

Figure 4:
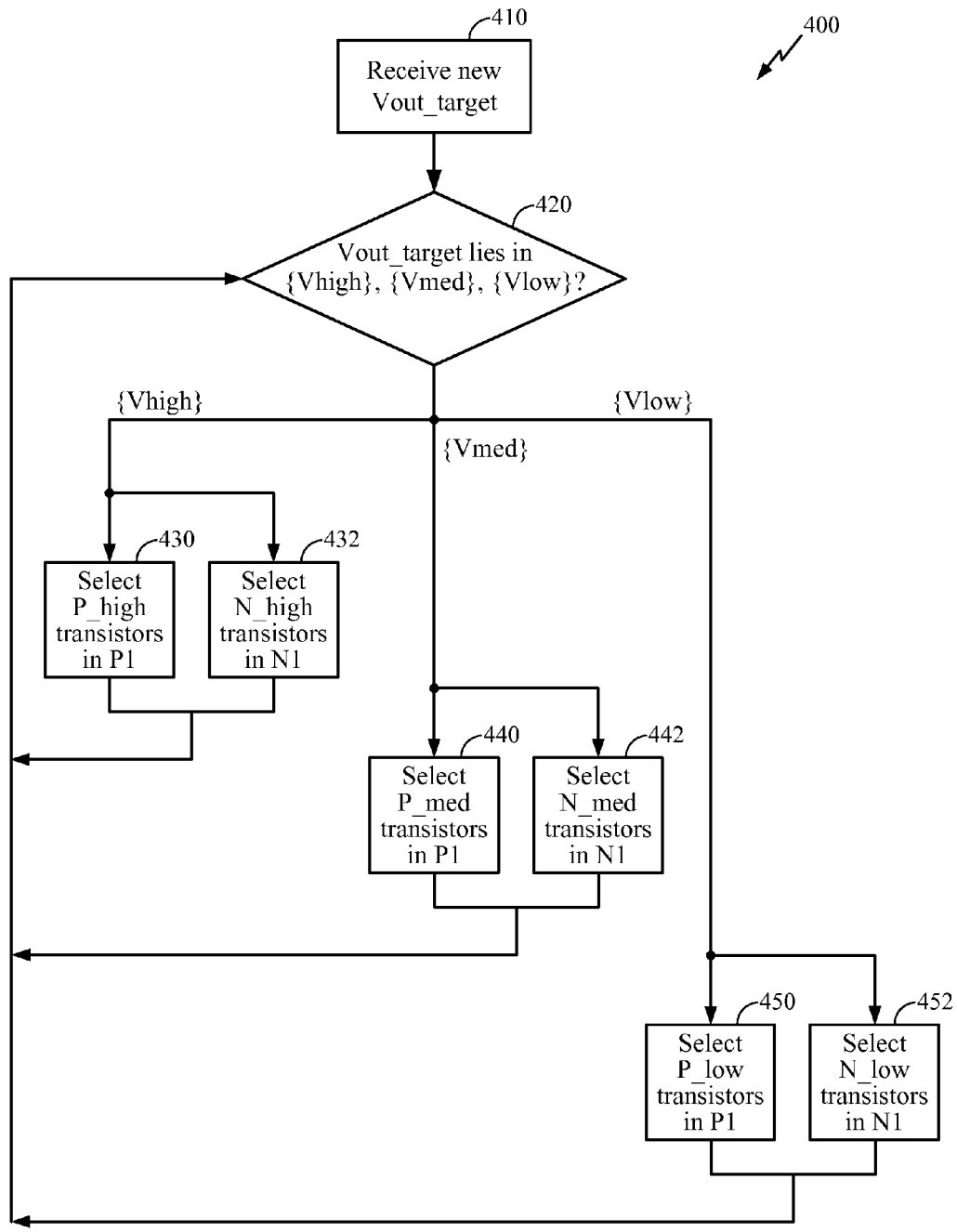
FIG. 4 illustrates an exemplary embodiment of a method that may be implemented by the control logic block.

FIG. 4 illustrates an exemplary embodiment 400 of a method that may be implemented by the control logic block 310. Note FIG. 4 is shown for illustrative purposes only, and is not meant to limit the scope of the present disclosure to any particular exemplary embodiment of a method shown.

In FIG. 4, at block 410, the target output voltage Vout_target is received. In an exemplary embodiment, the target output voltage Vout_target may be digitally programmed, e.g., by a microprocessor (not shown) writing to a register (not shown).

At block 420, it is determined whether Vout_target lies within a high voltage range {Vhigh}, a medium voltage range {Vmed}, or a low voltage range {Vlow}. In an exemplary embodiment, Vout_target may be determined to lie within the high voltage range if Vout_target>Vhigh_thresh, wherein Vhigh_thresh is a predetermined high-voltage threshold. Similarly, Vout_target may be determined to lie within the medium voltage range if Vmed_thresh1<Vout_target<Vmed_thresh2, and Vout_target may be determined to lie within the low voltage range if Vout_target<Vlow thresh.

In an exemplary embodiment, Vlow_thresh<=Vmed thresh1<Vmed_thresh2<=Vhigh. Note the threshold relationships and classification schemes for Vout_target are described for illustrative purposes only, and are not meant to limit the scope of the present disclosure to any particular thresholds. In alternative exemplary embodiments, fewer or more than the three voltage ranges described with reference to FIG. 4 (e.g., an arbitrary number N of ranges) may be provided, and the techniques disclosed herein may readily be adapted thereto. Such alternative exemplary embodiments are contemplated to be within the scope of the present disclosure.

In an exemplary embodiment, Vout_target may be specified in a K-bit register, and the target output voltage range, and corresponding switch size(s), may be determined by simply referring to the most significant bits (MSB's) of the register. For example, in an exemplary embodiment wherein four voltage ranges are defined, the 2 MSB's may be mapped to voltage ranges as follows: 00=>{Vlow}, 01=>{Vmed1}, 10=>{Vmed2}, and 11=>{Vhigh}, wherein a medium voltage range is split into two ranges {Vmed1}, {Vmed2}. Such alternative exemplary embodiments are contemplated to be within the scope of the present disclosure.

At block 420, depending on whether Vout_target lies within {Vhigh}, {Vmed}, or {Vlow}, the method proceeds to block 430/432, 440/442, or 450/452, respectively.

At block 430, a plurality P_high of PMOS transistors in P1 is selected. In an exemplary embodiment, P_high=P. In an exemplary embodiment, control voltages PCTRL.1 through PCTRL.P may be configured to enable a plurality P_high of PMOS transistors (and disable the remaining N-P_high PMOS transistors) of P1 whenever P1 is to be enabled, and to disable the P_high PMOS transistors whenever P1 is to be disabled, during the PFM switching cycles when Vout_target lies within {Vhigh}.

At block 432, a plurality N_high of NMOS transistors in N1 is selected. In an exemplary embodiment, N_high=1. In an exemplary embodiment, control voltages NCTRL.1 through NCTRL.N may be configured to enable only a plurality N_high of NMOS transistors (and disable the remaining N-N_high NMOS transistors) of N1 whenever N1 is to be enabled, and to disable the N_high NMOS transistors (along with the remaining N-N_high NMOS transistors) whenever N1 is to be disabled, during the PFM switching cycles when Vout_target lies within {Vhigh}.

Note in FIG. 4, blocks 430 and 432 are shown as being implemented in conjunction or in parallel, e.g., P_high transistors of P1 may be selected and N_high transistors of N1 may be selected whenever Vout_target lies within {Vhigh}. In alternative exemplary embodiments, however, only one of blocks 430 and 432 need be implemented, e.g., the dynamic switch size techniques of the present disclosure may be applied to only one of P1 and N1. These comments apply also to blocks 440/442, and 450/452 further described hereinbelow. For example, in an exemplary embodiment (not shown), P_high transistors of P1 may be selected while all N transistors of N1 are selected whenever Vout_target lies within Vhigh. Such alternative exemplary embodiments are contemplated to be within the scope of the present disclosure.

Upon the number of PMOS and/or NMOS transistors being selected for {Vhigh} according to blocks 430 and/or 432, the method returns to block 410.

At block 440, a plurality P_med of PMOS transistors in P1 is selected. In an exemplary embodiment, 1<P_med<P_high. In an exemplary embodiment, control voltages PCTRL.1 through PCTRL.P may be configured to enable only a plurality P_med of PMOS transistors (and disable the remaining P-P_med PMOS transistors) whenever P1 is to be enabled, and to disable the P_med PMOS transistors (along with the remaining P-P_med PMOS transistors) whenever P1 is to be disabled, during the PFM switching cycles when Vout_target lies within {Vmed}.

At block 442, a plurality N_med of NMOS transistors in N1 is selected. In an exemplary embodiment, N>N_med>N_high. In an exemplary embodiment, control voltages NCTRL.1 through NCTRL.N may be configured to enable only a plurality N_med of NMOS transistors (and disable the remaining N-N_high NMOS transistors) whenever N1 is to be enabled, and to disable the N_med NMOS transistors (along with the remaining N-N_high NMOS transistors) whenever N1 is to be disabled, during the PFM switching cycles when Vout_target lies within {Vmed}.

Upon the number of PMOS and/or NMOS transistors being selected for {Vmed} according to blocks 440 and/or 442, the method returns to block 410.

At block 450, a plurality P_low of PMOS transistors in P1 is selected. In an exemplary embodiment, P_low<P_med. In an exemplary embodiment, control voltages PCTRL.1 through PCTRL.P may be configured to enable only a plurality P_low of PMOS transistors (and disable the remaining P-P_low PMOS transistors) whenever P1 is to be enabled, and to disable the P_low PMOS transistors (along with the remaining P-P_low PMOS transistors) whenever P1 is to be disabled, during the PFM switching cycles when Vout_target lies within {Vlow}.

At block 452, a plurality N_low of NMOS transistors in N1 is selected. In an exemplary embodiment, N>=N_low>N_med>N_high. In an exemplary embodiment, control voltages NCTRL.1 through NCTRL.N may be configured to enable a plurality N_low of NMOS transistors (and disable the remaining N-N_low NMOS transistors, if any) whenever N1 is to be enabled, and to disable the N_low NMOS transistors whenever N1 is to be disabled, during the PFM switching cycles when Vout_target lies within {Vlow}.

Upon the number of PMOS and/or NMOS transistors being selected for {Vlow} according to blocks 450 and/or 452, the method returns to block 410.

Figure 5:
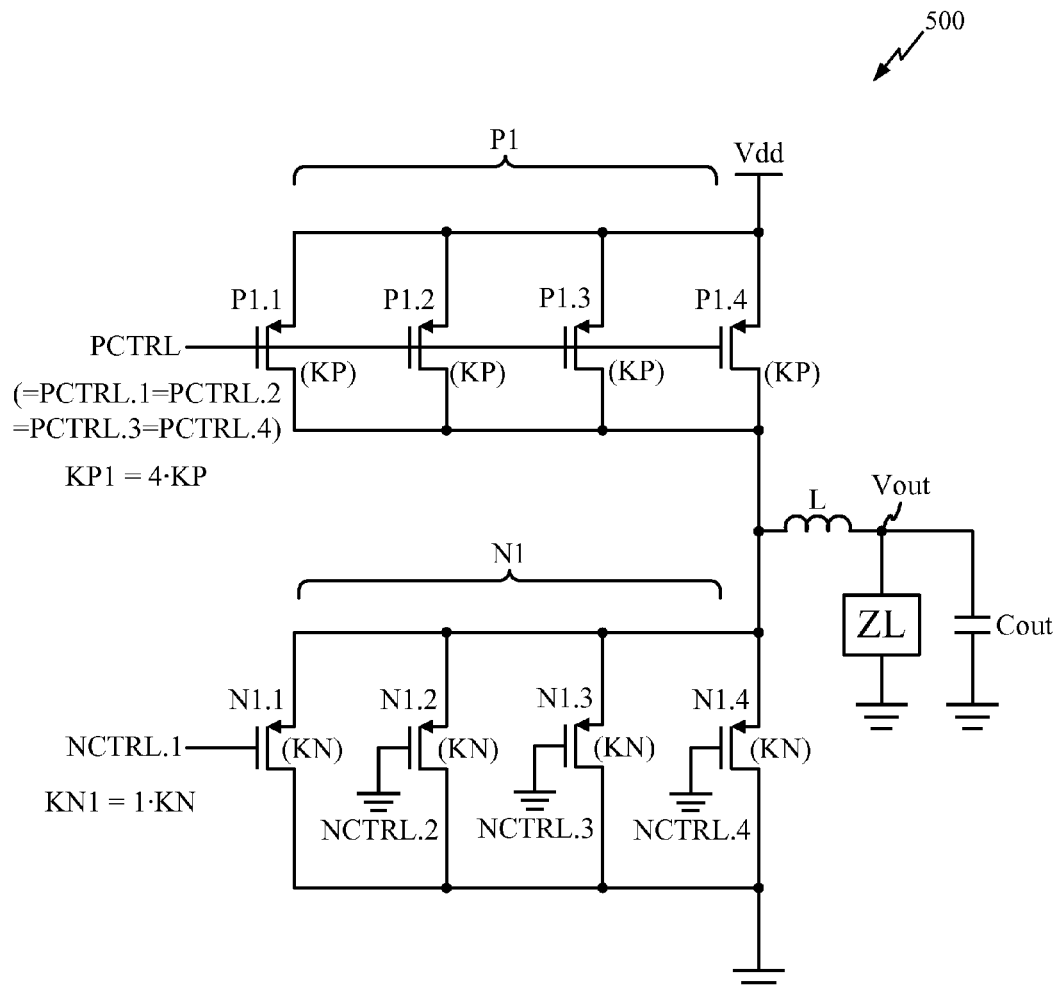
FIG. 5 illustrates an exemplary configuration of transistors according to the present disclosure, wherein the target output voltage lies in the high range {Vhigh}.

FIG. 5 illustrates an exemplary configuration 500 of transistors according to the present disclosure, wherein the target output voltage lies in the high range {Vhigh}. Note FIG. 5 is shown for illustrative purposes only, and is not meant to limit the scope of the present disclosure to any particular values for the variables shown. Further note that the configuration 500 shown in FIG. 5 is not meant to imply that the PMOS and NMOS transistors are ever to be simultaneously enabled during buck converter operation; rather, FIG. 5 will be understood to illustrate only the number of possible transistors that may be enabled when either P1 is on or N1 is on.

In FIG. 5, P=4, N=4, P_high=4, and N_high=1. Accordingly, when P1 is enabled, all 4 of the PMOS transistors P1.1, P1.2, P1.3, P1.4 are turned on. Similarly, when N1 is enabled, only 1 NMOS transistor N1.1 is turned on. Thus, it will be appreciated that when Vout_target is in the high range, then a relatively large size (i.e., width-to-length ratio) for the PMOS transistor is provided to minimize RDSon of the high-side switch. Conversely, a relatively small size for the NMOS transistor is provided to minimize the switching capacitance of the low-side switch.

Figure 6:
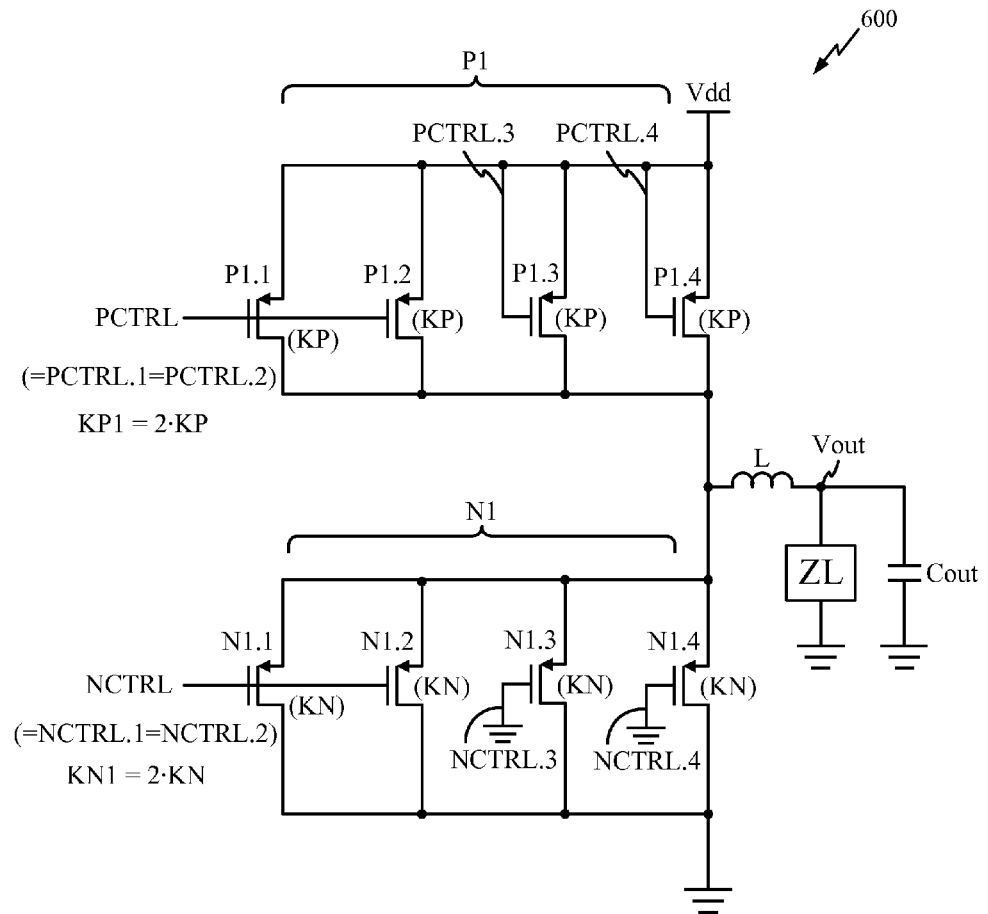
FIG. 6 illustrates an exemplary configuration of transistors according to the present disclosure, wherein the target output voltage lies in the medium range {Vmed}.

FIG. 6 illustrates an exemplary configuration 600 of transistors according to the present disclosure, wherein the target output voltage lies in the medium range {Vmed}. Note FIG. 6 is shown for illustrative purposes only, and is not meant to limit the scope of the present disclosure to any particular values for the variables shown.

In FIG. 6, P=4, N=4, P_med=2, and N_med=2. Accordingly, when P1 is enabled, 2 PMOS transistors P1.1, P1.2 are turned on, while P1.3, P1.4 are kept off. When N1 is enabled, 2 NMOS transistors N1.1, N1.2 are turned on, while N1.3, N1.4 are kept off.

Figure 7:
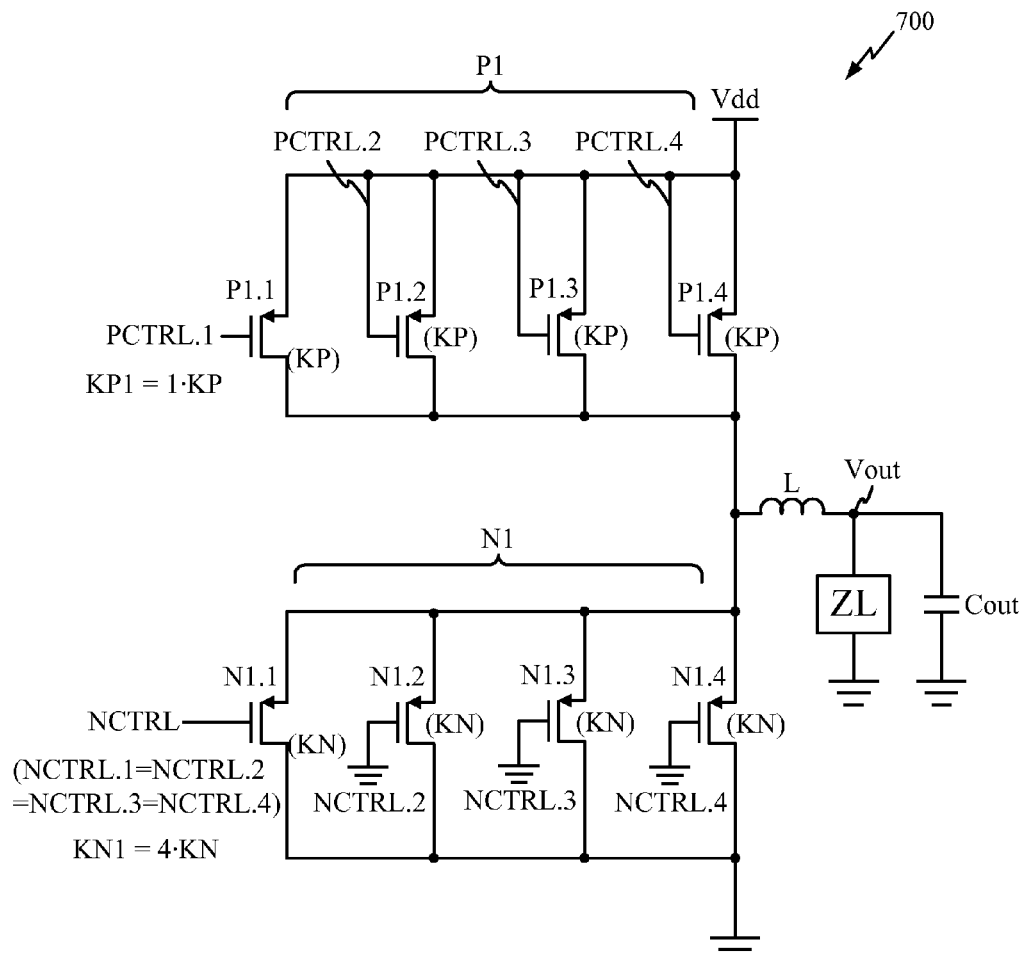
FIG. 7 illustrates an exemplary configuration of transistors according to the present disclosure, wherein the target output voltage lies in the low range {Vlow}.

FIG. 7 illustrates an exemplary configuration 700 of transistors according to the present disclosure, wherein the target output voltage lies in the low range {Vlow}. Note FIG. 7 is shown for illustrative purposes only, and is not meant to limit the scope of the present disclosure to any particular values for the variables shown.

In FIG. 7, P=4, N=4, P_low=1, and N_low=4. Accordingly, when N1 is enabled, all 4 of the NMOS transistors N1.1, N1.2, N1.3, N1.4 are turned on. When P1 is enabled, only 1 PMOS transistor P1.1 is turned on. Thus, it will be appreciated that when Vout_target is in the low range, then a relatively large size for the NMOS transistor N1 is provided to minimize RDSon of the low-side switch. Conversely, a relatively small size for the PMOS transistor P1 is provided to minimize the switching capacitance of the high-side switch.

Note alternative exemplary embodiments may adjust drive voltages for the transistor switches (rather than switch sizes) based on the output voltage, to reduce power losses and increase efficiency. In particular, energy stored in the gate of a transistor may be expressed as $\frac{1}{2}CV^2$, wherein V is the driving voltage of a transistor. As a high-to-low, or low-to-high transition in the transistor driving voltage will therefore be accompanied by corresponding power dissipation, it would be advantageous to, e.g., increase the driving voltage for the high-side switch when the target output voltage is higher, and decrease the driving voltage for the high-side switch when the target output voltage is lower. Similarly, it may be advantageous to increase the driving voltage for the low-side switch when the target output voltage is lower, and decrease the driving voltage for the low-side switch when the target output voltage is higher. Such alternative exemplary embodiments are contemplated to be within the scope of the present disclosure.

It will thus be appreciated that dynamically adjusting the driving capability of the switches based on the target output voltage as described hereinabove advantageously optimizes the trade-offs between minimizing switching losses and minimizing conduction losses for the buck converter.

Figure 8:
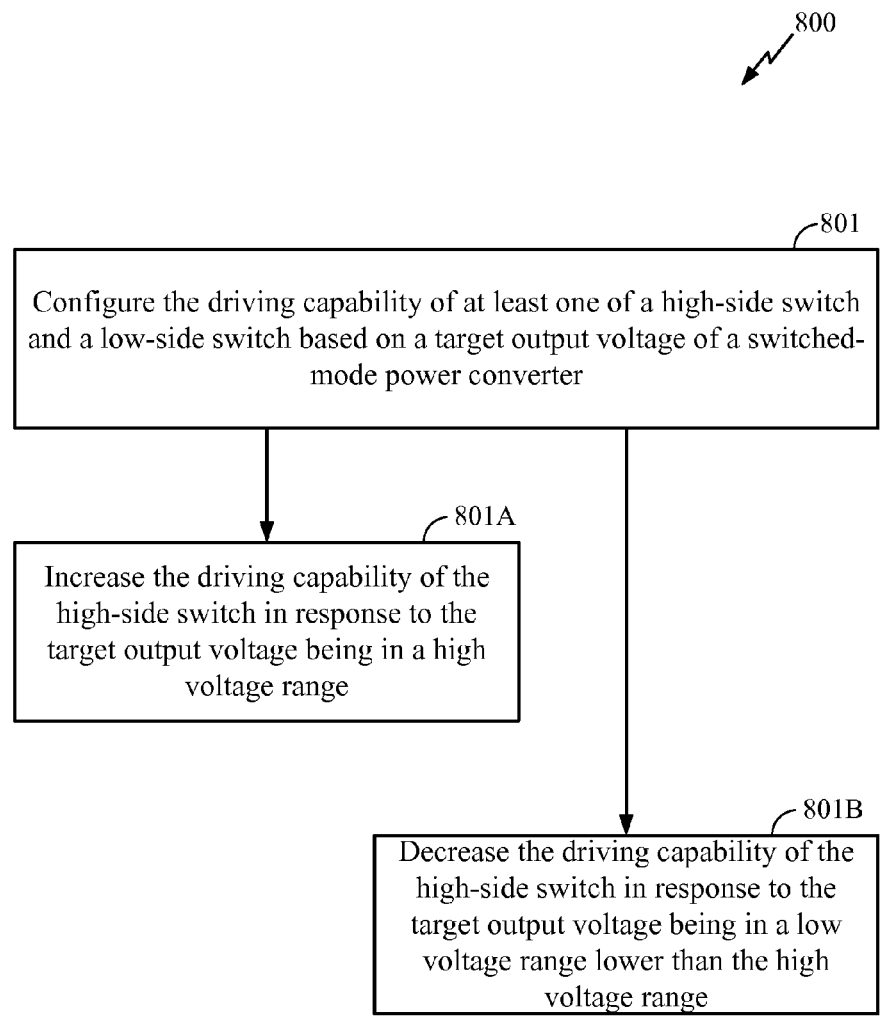
FIG. 8 illustrates an exemplary embodiment of a method according to the present disclosure.

FIG. 8 illustrates an exemplary embodiment of a method 800 according to the present disclosure. Note FIG. 8 is shown for illustrative purposes only, and is not meant to limit the scope of the present disclosure to any particular method.

In FIG. 8, at block 801 during a low-current mode, the driving capability of at least one of a high-side switch and a low-side switch is configured based on a target output voltage of a switched-mode power converter. In an exemplary embodiment, the switched-mode power converter may be a buck converter. In an alternative exemplary embodiment, the switched-mode power converter may be a boost converter. In an exemplary embodiment, the driving capability may correspond to the size of the switch. In an alternative exemplary embodiment, the driving capability may correspond to the magnitude of the drive voltage applied to the switch.

The block 801 may include, at block 801A, increasing the driving capability of the high-side switch in response to the target output voltage being in a high voltage range.

The block 801 may further include, at block 801B, decreasing the driving capability of the high-side switch in response to the target output voltage being in a low voltage range lower than the high voltage range.

In an exemplary embodiment, the contents of a register holding the digital value of Vout_target may be provided to the control logic block 310 in FIG. 3 to dynamically determine the size of the high-side and low-side transistors for each voltage range (e.g., low, medium, high, etc.). For example, a decode table may be provided storing the preferred sizes for the PMOS and NMOS transistors for each of four specific voltage ranges, and such sizes may determine the particular settings for the control voltages PCTRL, NCTRL (e.g., the number of parallel-coupled transistors that will be enabled when the high-side or low-side transistor is enabled) for each range.

Note while exemplary embodiments of the present disclosure have been described wherein switch size is selected based on a buck converter output voltage, it will be appreciated that a boost converter may also utilize the techniques of the present disclosure. In particular, the high- and low-side switch sizes may be similarly adjusted based on a boost converter output voltage, for optimizing boost converter operation to reduce the losses and thereby increase efficiency.

Note while exemplary embodiments have been described hereinabove wherein a PMOS transistor is used as the high-side switch coupling the inductor L to Vdd, the techniques described may readily be utilized in alternative exemplary embodiments employing elements other than a PMOS transistor for the high-side switch. For example, in an alternative exemplary embodiment (not shown), an NMOS switch may also be utilized, and the size of the NMOS (high-side) switch may be adjusted based on target output voltage per the techniques described herein. Such alternative exemplary embodiments are contemplated to be within the scope of the present disclosure.

Figure 9:
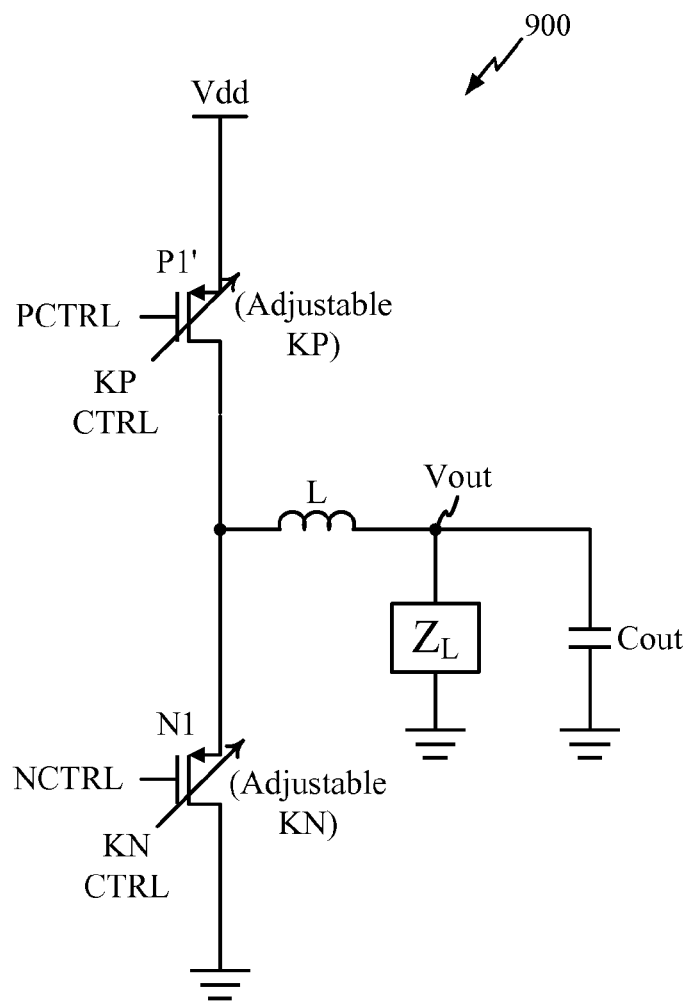
FIG. 9 illustrates an alternative exemplary embodiment according to the present disclosure, wherein the switch sizes are generally adjustable without limitation to any particular technique for switch size adjustment.
Figure 9:
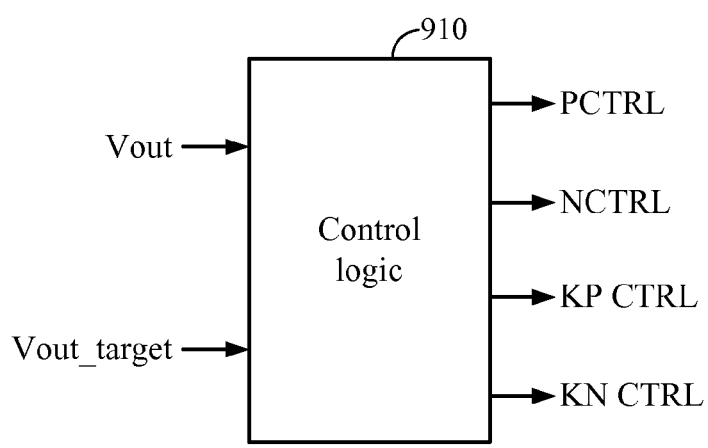

While exemplary embodiments have described hereinabove wherein size of a transistor switch is adjusted by increasing or decreasing the number of transistors coupled in parallel, it will be appreciated that alternative exemplary embodiments may adjust transistor size using other techniques, e.g., increasing or decreasing the number of transistors coupled in series, or any other network configuration wherein transistor size may be adjusted. For example, FIG. 9 illustrates an alternative exemplary embodiment 900 according to the present disclosure, wherein the switch sizes are generally adjustable without limitation to any particular technique for switch size adjustment. In FIG. 9, control logic block 910 generates switch on-off control signals PCTRL, NCTRL, and further switch size adjustment control signals KP CTRL, KN CTRL for switches P1', N1', respectively. KP CTRL and KN CTRL are applied to control the sizes of switches P1' and N1' having adjustable sizes. In an exemplary embodiment, the switch sizes of KP and/or KN may be mapped according to the target output voltage Vout_target input to block 910, according to the techniques of the present disclosure.

In this specification and in the claims, the term "driving capability" may denote any parameter that affects the driving capability of a high-side or low-side switch. For example, an increased driving capability for a transistor may include an increased size for the transistor, or an increased gate driving voltage for the transistor, either of which will be understood to increase the driving capability of a transistor.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
    a plurality of parallel-coupled PMOS transistors that couple a source voltage to an inductor;
    a plurality of parallel-coupled NMOS transistors that couple the inductor to ground, wherein the inductor is coupled to provide an output voltage that is driven to a target output voltage; and
    a control logic block that generates a plurality of gate control voltages that control each of the plurality of parallel-coupled PMOS transistors and the plurality of parallel-coupled NMOS transistors based on the target output voltage,
    wherein in response to the target output voltage being adjusted, the control logic block adjusts a quantity of either or both of the plurality of parallel-coupled PMOS transistors and the plurality of parallel-coupled NMOS transistors that are selectively enabled,
    wherein in response to the target output voltage being decreased, the control logic block increases the quantity of the plurality of parallel-coupled NMOS transistors that are selectively enabled.

2. The apparatus of claim 1, wherein the control logic block comprises a decode table that stores a mapping between each of a plurality of voltage ranges and corresponding gate control voltages for the plurality of parallel-coupled PMOS transistors and the plurality of parallel-coupled NMOS transistors.

3. The apparatus of claim 1, wherein in response to the target output voltage being adjusted, the control logic block adjusts the quantity of either the plurality of parallel-coupled PMOS transistors or the plurality of parallel-coupled NMOS transistors that are selectively enabled but not the quantity of both of the plurality of parallel-coupled PMOS transistors and the plurality of parallel-coupled NMOS transistors.

4. The apparatus of claim 1, wherein in response to the target output voltage being adjusted, the control logic block adjusts the quantity of both the plurality of parallel-coupled PMOS transistors and the plurality of parallel-coupled NMOS transistors that are selectively enabled.

5. The apparatus of claim 1, wherein in response to the target output voltage being increased, the control logic block increases the quantity of the plurality of parallel-coupled PMOS transistors that are selectively enabled.

6. The apparatus of claim 1, wherein the plurality of parallel-coupled PMOS transistors comprise a high-side switch, wherein a size of the high-side switch is determined according to the quantity of the plurality of parallel-coupled PMOS transistors that are selectively enabled.

7. The apparatus of claim 1, wherein the plurality of parallel-coupled NMOS transistors comprise a low-side switch, wherein a size of the low-side switch is determined according to the quantity of the plurality of parallel-coupled NMOS transistors that are selectively enabled.

8. The apparatus of claim 1, wherein the plurality of parallel-coupled PMOS transistors each have an identical size.

9. The apparatus of claim 1, wherein the plurality of parallel-coupled NMOS transistors each have an identical size.

10. The apparatus of claim 1, wherein the plurality of parallel-coupled PMOS transistors has a plurality of sizes according to a binary-weighted scheme.

11. The apparatus of claim 1, wherein the plurality of parallel-coupled NMOS transistors has a plurality of sizes according to a binary-weighted scheme.

12. The apparatus of claim 1, wherein a number of the plurality of parallel-coupled PMOS transistors equals a number of the plurality of parallel-coupled NMOS transistors.

13. The apparatus of claim 1, wherein a number of the plurality of parallel-coupled PMOS transistors differs from a number of the plurality of parallel-coupled NMOS transistors.

14. The apparatus of claim 1, wherein the plurality of parallel-coupled PMOS transistors comprise a high-side switch, wherein the plurality of parallel-coupled NMOS transistors comprise a low-side switch, and wherein the control logic block controls a driving capability of at least one of the high-side switch and the low-side switch based on the target output voltage to which the output voltage is driven.

15. The apparatus of claim 1, wherein the plurality of parallel-coupled PMOS transistors operates according to pulse frequency modulation, wherein the control logic block increases the quantity of the plurality of parallel-coupled PMOS transistors in response to the target voltage being in a high voltage range, and wherein the control logic block decreases the quantity of the plurality of parallel-coupled PMOS transistors in response to the target output voltage being in a low voltage range lower than the high voltage range.

16. The apparatus of claim 1, wherein the plurality of parallel-coupled NMOS transistors operates according to pulse frequency modulation, wherein the control logic block increases the quantity of the plurality of parallel-coupled NMOS transistors in response to the target voltage being in a low voltage range, and wherein the control logic block decreases the quantity of the plurality of parallel-coupled NMOS transistors in response to the target output voltage being in a high voltage range higher than the low voltage range.

17. The apparatus of claim 1, wherein the control logic block adjusts the quantity of the plurality of parallel-coupled PMOS transistors and the plurality of parallel-coupled NMOS transistors that are selectively enabled based on the target output voltage during a low-current mode of the apparatus.

18. A method, comprising:
   providing a plurality of parallel-coupled PMOS transistors that couple a source voltage to an inductor;
   providing a plurality of parallel-coupled NMOS transistors that couple the inductor to ground, wherein the inductor is coupled to an output voltage that is driven to a target output voltage;
   providing a control logic block coupled to the plurality of parallel-coupled PMOS transistors and the plurality of parallel-coupled NMOS transistors;
   generating, by the control logic block, a plurality of gate control voltages that control each of the plurality of parallel-coupled PMOS transistors and the plurality of parallel-coupled NMOS transistors; and
   adjusting, by the control logic block in response to the target output voltage being adjusted, a quantity of the plurality of parallel-coupled PMOS transistors and the plurality of parallel-coupled NMOS transistors that are selectively enabled,
   wherein in response to the target output voltage being decreased, the control logic block increases the quantity of the plurality of parallel-coupled NMOS transistors that are selectively enabled.

* * * * *